(12) United States Patent
Morikazu

(10) Patent No.: US 8,912,464 B2
(45) Date of Patent: Dec. 16, 2014

(54) HOLE FORMING METHOD AND LASER PROCESSING APPARATUS

(75) Inventor: Hiroshi Morikazu, Ota-Ku (JP)

(73) Assignee: Disco Corporation, Tokyo (JP)

( * ) Notice: Subject to any disclaimer, the term of this patent is extended or adjusted under 35 U.S.C. 154(b) by 303 days.

(21) Appl. No.: 13/592,974

(22) Filed: Aug. 23, 2012

(65) Prior Publication Data

US 2013/0048617 A1 Feb. 28, 2013

(30) Foreign Application Priority Data

Aug. 24, 2011 (JP) ................................. 2011-182358

(51) Int. Cl.

| B23K 26/03 | (2006.01) |
|---|---|
| B23K 26/40 | (2014.01) |
| B23K 26/00 | (2014.01) |
| B23K 26/36 | (2014.01) |
| B23K 26/06 | (2014.01) |
| B23K 26/08 | (2014.01) |
| B23K 26/38 | (2014.01) |
| H01L 21/768 | (2006.01) |

(52) U.S. Cl.
CPC ............. *B23K 26/032* (2013.01); *B23K 26/409* (2013.01); *B23K 26/4085* (2013.01); *H01L 21/76802* (2013.01); *B23K 26/0048* (2013.01); *B23K 26/365* (2013.01); *B23K 26/0626* (2013.01); *B23K 26/0853* (2013.01); *B23K 26/381* (2013.01); *B23K 26/4075* (2013.01); *B23K 2201/40* (2013.01)
USPC .............. 219/121.62; 219/121.7; 219/121.71; 216/94

(58) Field of Classification Search
CPC H01L 21/302; H01L 21/768; B23K 26/0048; B23K 26/365; B23K 26/4085; B23K 26/409
USPC ............... 219/121.62, 121.7, 121.71, 121.83; 216/94; 250/492.1, 492.2; 438/637; 156/513
See application file for complete search history.

(56) References Cited

U.S. PATENT DOCUMENTS 7,887,712 B2 * 2/2011 Boyle et al. .................... 216/65

FOREIGN PATENT DOCUMENTS

| JP | 2003-163323 | 6/2003 |
| JP | 2007-067082 | 3/2007 |
| JP | 2009-125756 | 6/2009 |

* cited by examiner

*Primary Examiner* — Samuel M Heinrich
(74) *Attorney, Agent, or Firm* — Greer Burns & Crain Ltd.

(57) ABSTRACT

A laser processed hole is formed in a workpiece. The workpiece has a first member formed of a first material bonded to a second member formed of a second material. A value is set representing the minimum number of shots of a pulsed laser beam when the spectral wavelength of plasma has changed from the spectral wavelength inherent in the first material to that of the second material. A maximum shot number is set representing a maximum value of the number of beam shots when the spectral wavelength of the plasma has completely changed. The beam is stopped if the number of shots has reached the minimum value and the spectral wavelength of the plasma has changed whereas the beam is continued until the number of shots reaches the maximum value if the spectral wavelength of the plasma has not changed even after the number of shots has reached the minimum value.

2 Claims, 10 Drawing Sheets

HOLE FORMING METHOD AND LASER PROCESSING APPARATUS

BACKGROUND OF THE INVENTION

1. Field of the Invention

The present invention relates to a hole forming method and a laser processing apparatus for forming a laser processed hole in a workpiece configured by bonding a first member formed of a first material and a second member formed of a second material, the laser processed hole extending from the first member to the second member.

2. Description of the Related Art

In a semiconductor device fabrication process, a plurality of crossing division lines called streets are formed on the front side of a substantially disk-shaped semiconductor wafer to thereby partition a plurality of regions where devices such as ICs and LSIs are respectively formed. The semiconductor wafer is cut along the streets to thereby divide the regions where the devices are formed from each other, thus obtaining individual semiconductor chips. For the purposes of achieving smaller sizes and higher functionality of equipment, a module structure having the following configuration is in practical use. This module structure is such that a plurality of devices are stacked and bonding pads provided on each device are connected to each other. In this module structure, through holes (via holes) are formed in a semiconductor wafer at positions corresponding to the bonding pads, and a conductive material such as aluminum is embedded in each via hole so as to be connected to the corresponding bonding pad (see Japanese Patent Laid-open No. 2003-163323, for example).

Each via hole in the semiconductor wafer mentioned above is formed by using a drill. However, the diameter of each via hole in the semiconductor wafer is as small as 90 to 300 μm, so that the formation of each via hole by using a drill causes a reduction in productivity. To solve this problem, there has been proposed a hole forming method for a wafer composed of a substrate and a plurality of devices formed on the front side of the substrate, a plurality of bonding pads being formed on each device, wherein a pulsed laser beam is applied to the substrate from the back side thereof to thereby efficiently form a plurality of via holes respectively reaching the plural bonding pads (see Japanese Patent Laid-open No. 2007-67082, for example).

The wavelength of the pulsed laser beam is selected so as to have low absorptivity to the metal forming the bonding pads and have high absorptivity to the material forming the substrate, such as silicon and lithium tantalate. However, in applying the pulsed laser beam to the substrate from the back side thereof to thereby form the via holes respectively reaching the bonding pads, it is difficult to stop the application of the pulsed laser beam at the time each via hole formed in the substrate has reached the corresponding bonding pad, causing a problem that the bonding pads may be melted to be perforated by the pulsed laser beam. To solve this problem in the hole forming method for the wafer disclosed in Japanese Patent Laid-open No. 2007-67082, there has been proposed a laser processing apparatus such that a laser beam is applied to a material to generate a plasma from the material, and a spectrum caused by this plasma and inherent in the material is detected to thereby determine whether or not the laser beam has reached each bonding pad formed of metal (see Japanese Patent Laid-open No. 2009-125756, for example).

SUMMARY OF THE INVENTION

Each bonding pad formed of metal is located at the bottom of a fine hole formed by applying a laser beam to the substrate. Accordingly, even when the laser beam is applied to each bonding pad, the material of the substrate causes noise, which hinders proper generation the plasma from the metal forming each bonding pad. Accordingly, it is difficult to determine that the laser beam has reached each bonding pad of metal, causing a problem that each bonding pad may be melted to be perforated.

It is therefore an object of the present invention to provide a hole forming method and a laser processing apparatus which can efficiently form a laser processed hole in a workpiece configured by bonding a first member formed of a first material and a second member formed of a second material, the laser processed hole extending from the first member to the second member.

In accordance with an aspect of the present invention, there is provided a hole forming method of forming a laser processed hole in a workpiece configured by bonding a first member formed of a first material and a second member formed of a second material, the laser processed hole extending from the first member to the second member, the hole forming method including a minimum shot number setting step of applying a pulsed laser beam to an arbitrary area of the workpiece from the side of the first member to form the laser processed hole, counting the number of shots of the pulsed laser beam, measuring a material-inherent spectral wavelength of plasma generated by the application of the pulsed laser beam, and setting as a minimum value the number of shots of the pulsed laser beam at the time the spectral wavelength of the plasma has changed from the spectral wavelength inherent in the first material to the spectral wavelength inherent in the second material; a maximum shot number setting step of setting as a maximum value the number of shots of the pulsed laser beam at the time the spectral wavelength of the plasma has completely changed from the spectral wavelength inherent in the first material to the spectral wavelength inherent in the second material; and a hole forming step of applying the pulsed laser beam to a predetermined position on the workpiece from the side of the first member to form the laser processed hole, counting the number of shots of the pulsed laser beam, measuring the material-inherent spectral wavelength of the plasma generated by the application of the pulsed laser beam, and stopping the application of the pulsed laser beam in the case that the number of shots of the pulsed laser beam has reached the minimum value and the spectral wavelength of the plasma has changed from the spectral wavelength inherent in the first material to the spectral wavelength inherent in the second material, whereas continuing the application of the pulsed laser beam until the number of shots of the pulsed laser beam reaches the maximum value in the case that the spectral wavelength of the plasma has not changed from the spectral wavelength inherent in the first material to the spectral wavelength inherent in the second material even after the number of shots of the pulsed laser beam has reached the minimum value.

In accordance with another aspect of the present invention, there is provided a laser processing apparatus for forming a laser processed hole in a workpiece configured by bonding a first member formed of a first material and a second member formed of a second material, the laser processed hole extending from the first member to the second member, the laser processing apparatus including workpiece holding means for holding the workpiece; laser beam applying means for applying a pulsed laser beam to the workpiece held by the workpiece holding means; moving means for relatively moving the workpiece holding means and the laser beam applying means; plasma detecting means for detecting a spectral wavelength of plasma generated by applying the pulsed laser beam from the laser beam applying means to the workpiece; and control means having a memory for storing a minimum value and a maximum value for the number of shots of the pulsed laser beam as required for the formation of the laser processed hole and a counter for counting the number of shots of the pulsed laser beam applied by the laser beam applying means, the control means controlling the laser beam applying means according to a count value from the counter and a detection signal from the plasma detecting means; wherein the control means controls the laser beam applying means so that the pulsed laser beam is applied to a predetermined position on the workpiece from the side of the first member to form the laser processed hole, and the application of the pulsed laser beam is stopped in the case that the number of shots of the pulsed laser beam has reached the minimum value and the spectral wavelength of the plasma has changed from the spectral wavelength inherent in the first material to the spectral wavelength inherent in the second material, whereas the application of the pulsed laser beam is continued until the number of shots of the pulsed laser beam reaches the maximum value in the case that the spectral wavelength of the plasma has not changed from the spectral wavelength inherent in the first material to the spectral wavelength inherent in the second material even after the number of shots of the pulsed laser beam has reached the minimum value.

In the hole forming step of the hole forming method according to the present invention, the pulsed laser beam is applied to a predetermined position on the workpiece from the side of the first member to form the laser processed hole. In forming the laser processed hole, the number of shots of the pulsed laser beam is counted and the material-inherent spectral wavelength of the plasma generated by the application of the pulsed laser beam is measured. Further, in the case that the number of shots of the pulsed laser beam has reached the minimum value and the spectral wavelength of the plasma has changed from the spectral wavelength inherent in the first material to the spectral wavelength inherent in the second material, the application of the pulsed laser beam is stopped, whereas in the case that the spectral wavelength of the plasma has not changed from the spectral wavelength inherent in the first material to the spectral wavelength inherent in the second material even after the number of shots of the pulsed laser beam has reached the minimum value, the application of the pulsed laser beam is continued until the number of shots of the pulsed laser beam reaches the maximum value. Accordingly, even when the plasma is not properly generated by the application of the pulsed laser beam, there is no possibility that the second member may be melted. In the case that the workpiece is a wafer including a substrate (first member), a plurality of devices formed on the front side of the substrate, and a plurality of bonding pads (second member) provided on each device and that the plural laser processed holes respectively extend from the back side of the substrate (first member) to the plural bonding pads (second member), there is no possibility that each bonding pad (second member) may be melted to be perforated.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENT

Figure 1:
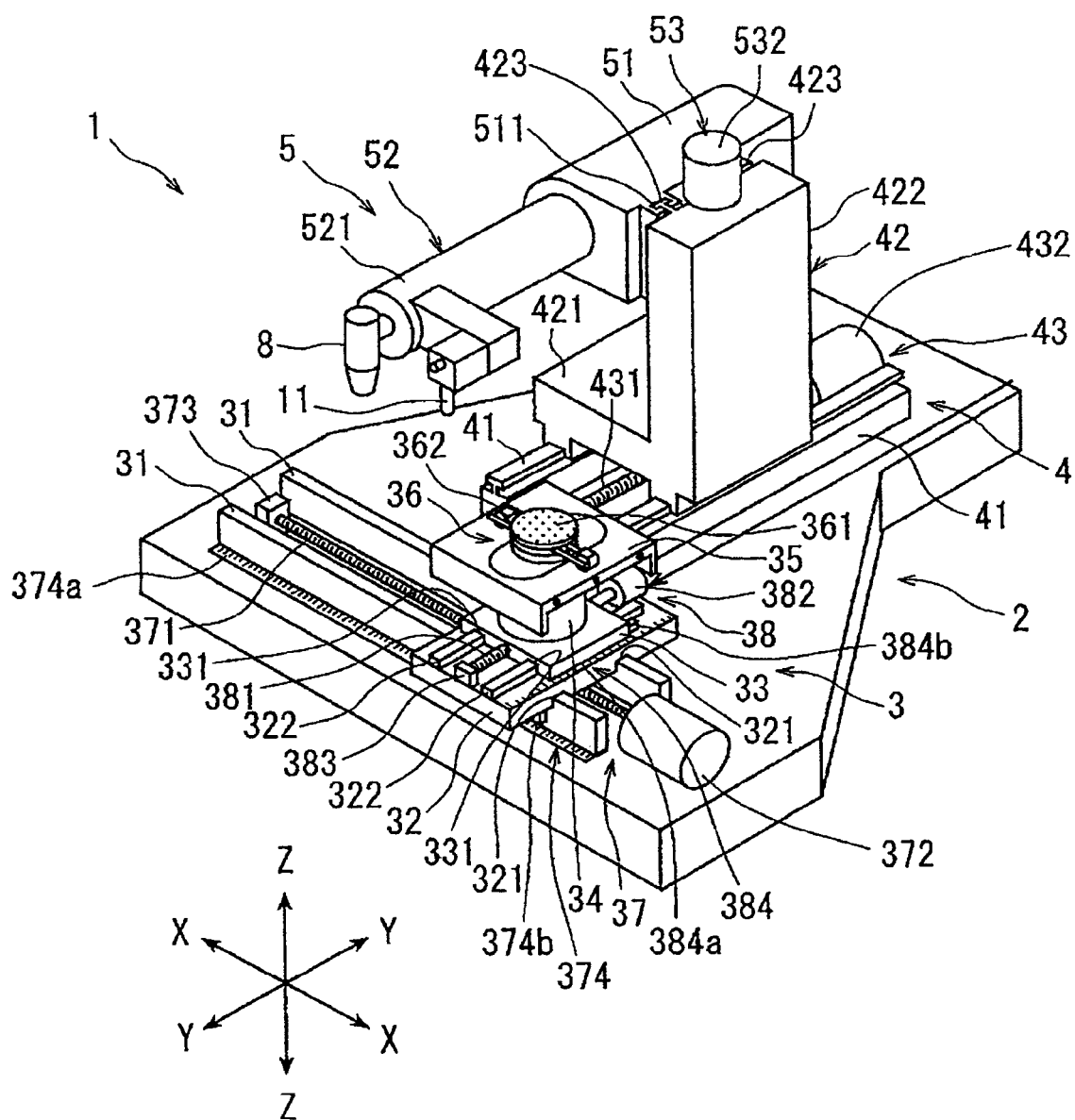
FIG. 1 is a perspective view of a laser processing apparatus according to a preferred embodiment of the present invention.

A preferred embodiment of the hole forming method and the laser processing apparatus according to the present invention will now be described in detail with reference to the attached drawings. FIG. 1 is a perspective view of a laser processing apparatus 1 according to a preferred embodiment of the present invention. The laser processing apparatus 1 shown in FIG. 1 includes a stationary base 2, a chuck table mechanism 3 for holding a workpiece, the chuck table mechanism 3 being provided on the stationary base 2 so as to be movable in a feeding direction (X direction) shown by an arrow X, a laser beam applying unit supporting mechanism 4 provided on the stationary base 2 so as to be movable in an indexing direction (Y direction) shown by an arrow Y perpendicular to the X direction, and a laser beam applying unit 5 provided on the laser beam applying unit supporting mechanism 4 so as to be movable in a focal position adjusting direction (Z direction) shown by an arrow Z.

The chuck table mechanism 3 includes a pair of guide rails 31, 31 provided on the stationary base 2 so as to extend parallel to each other in the X direction, a first slide block 32 provided on the guide rails 31, 31 so as to be movable in the X direction, a second slide block 33 provided on the first slide block 32 so as to be movable in the Y direction, a cover table 35 supported by a cylindrical member 34 standing on the second slide block 33, and a chuck table 36 as workpiece holding means. The chuck table 36 has a vacuum chuck 361 formed of a porous material. A workplace such as a disk-shaped semiconductor wafer is adapted to be held under suction on the vacuum chuck 361 by operating suction means (not shown). The chuck table 36 configured as above is rotatable by a pulse motor (not shown) provided in the cylindrical member 34. Further, the chuck table 36 is provided with clamps 362 for fixing an annular frame (to be hereinafter described) supporting the wafer.

The lower surface of the first slide block 32 is formed with a pair of guided grooves 321, 321 for slidably engaging the pair of guide rails 31, 31 mentioned above. A pair of guide rails 322, 322 are provided on the upper surface of the first slide block 32 so as to extend parallel to each other in the Y direction. Accordingly, the first slide block 32 configured as above is movable in the X direction along the guide rails 31, 31 by the slidable engagement of the guided grooves 321, 321 with the guide rails 31, 31. The chuck table mechanism 3 according to the embodiment shown in the drawing further includes X direction moving means (feeding means 37) for moving the first slide block 32 in the X direction along the guide rails 31, 31. The feeding means 37 includes an externally threaded rod 371 extending parallel to the guide rails 31 and 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31, 31 by operating the pulse motor 372 to normally or reversely rotate the externally threaded rod 371.

The laser processing apparatus 1 includes X position detecting means 374 for detecting the feed amount, or X position of the chuck table 36. The X position detecting means 374 includes a linear scale 374a extending along one of the guide rails 31 and a read head 374b provided on the first slide block 32 and movable along the linear scale 374a together with the first slide block 32. The read head 374b of the X position detecting means 374 transmits a pulse signal of one pulse every 1 μm in this preferred embodiment of the drawings to control means which will be hereinafter described. This control means counts the number of pulses as the pulse signal input from the read head 374b to thereby detect the feed amount, or X position of the chuck table 36. In the case that the pulse motor 372 is used as the drive source for the feeding means 37 as in this preferred embodiment, the number of pulses as a drive signal output from the control means to the pulse motor 372 may be counted by the control means to thereby detect the feed amount, or X position of the chuck table 36. In the case that a servo motor is used as the drive source for the feeding means 37, a pulse signal output from a rotary encoder for detecting the rotational speed of the servo motor may be sent to the control means, and the number of pulses as the pulse signal input from the rotary encoder into the control means may be counted by the control means to thereby detect the feed amount, or X position of the chuck table 36.

The lower surface of the second slide block 33 is formed with a pair of guided grooves 331, 331 for slidably engaging the pair of guide rails 322, 322 provided on the upper surface of the first slide block 32 as mentioned above. Accordingly, the second slide block 33 is movable in the Y direction by the slidable engagement of the guided grooves 331, 331 with the guide rails 322, 322. The chuck table mechanism 3 according to the embodiment shown in the drawing further includes first Y direction moving means (first indexing means 38) for moving the second slide block 33 in the Y direction along the guide rails 322, 322 provided on the first slide block 32. The first indexing means 38 includes an externally threaded rod 381 extending parallel to the guide rails 322 and 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322, 322 by operating the pulse motor 382 to normally or reversely rotate the externally threaded rod 381.

The laser processing apparatus 1 includes Y position detecting means 384 for detecting the index amount, or Y position of the chuck table 36. The Y position detecting means 384 includes a linear scale 384a extending along one of the guide rails 322 and a read head 384b provided on the second slide block 33 and movable along the linear scale 384a together with the second slide block 33. The read head 384b of the Y position detecting means 384 transmits a pulse signal of one pulse every 1 μm in this preferred embodiment shown in the figure to the control means which will be described later. This control means counts the number of pulses as the pulse signal input from the read head 384b to thereby detect the index amount, or Y position of the chuck table 36. In the case that the pulse motor 382 is used as the drive source for the first indexing means 38 as in this preferred embodiment, the number of pulses as a drive signal output from the control means to the pulse motor 382 may be counted by the control means to thereby detect the index amount, or Y position of the chuck table 36. In the case that a servo motor is used as the drive source for the first indexing means 38, a pulse signal output from a rotary encoder for detecting the rotational speed of the servo motor may be sent to the control means, and the number of pulses as the pulse signal input from the rotary encoder into the control means may be counted by the control means to thereby detect the index amount, or Y position of the chuck table 36.

The laser beam applying unit supporting mechanism 4 includes a pair of guide rails 41, 41 provided on the stationary base 2 so as to extend parallel to each other in the Y direction and a movable support base 42 provided on the guide rails 41, 41 so as to be movable in the Y direction. The movable support base 42 is composed of a horizontal portion 421 slidably supported to the guide rails 41, 41 and a vertical portion 422 extending vertically upward from the upper surface of the horizontal portion 421. Further, a pair of guide rails 423, 423 are provided on one side surface of the vertical portion 422 so as to extend parallel to each other in the Z direction. The laser beam applying unit supporting mechanism 4 according to the embodiment shown in the drawings further includes second Y direction moving means (second indexing means 43) for moving the movable support base 42 in the Y direction along the guide rails 41, 41. The second indexing means 43 includes an externally threaded rod 431 extending parallel to the guide rails 41, 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and is connected at the other end to the output shaft of the pulse motor 432 so as to receive the torque thereof. The externally threaded rod 431 is engaged with a tapped through hole formed in an internally threaded block (not shown) projecting from the lower surface of the horizontal portion 421 configuring the movable support base 42 at a central portion thereof. Accordingly, the movable support base 42 is moved in the Y direction along the guide rails 41, 41 by operating the pulse motor 432 to normally or reversely rotate the externally threaded rod 431.

The laser beam applying unit 5 includes a unit holder 51 and laser beam applying means 52 mounted to the unit holder 51. The unit holder 51 is formed with a pair of guided grooves 511, 511 for slidably engaging the pair of guide rails 423, 423 provided on the vertical portion 422 of the movable support base 42. Accordingly, the unit holder 51 is supported to the movable support base 42 so as to be movable in the Z direction by the slidable engagement of the guided grooves 511, 511 with the guide rails 423, 423.

The laser beam applying unit 5 further includes Z direction moving means (focal position adjusting means 53) for moving the unit holder 51 along the guide rails 423, 423 in the Z direction. The focal position adjusting means 53 includes an externally threaded rod (not shown) extending parallel to the guide rails 423, 423 so as to be interposed therebetween and a pulse motor 532 as a drive source for rotationally driving this externally threaded rod. Accordingly, the unit holder 51 and the laser beam applying means 52 are moved in the Z direction along the guide rails 423, 423 by operating the pulse motor 532 to normally or reversely rotate this externally threaded rod. In this preferred embodiment, when the pulse motor 532 is normally operated, the laser beam applying means 52 is moved upward, whereas when the pulse motor 532 is reversely operated, the laser beam applying means 52 is moved downward.

The laser beam applying means 52 includes a cylindrical casing 521 fixed to the unit holder 51 so as to extend in a substantially horizontal direction, pulsed laser beam oscillating means 6 (see FIG. 2) provided in the casing 521, acoustooptic deflecting means 7 (see FIG. 2) as light deflecting means for deflecting the beam axis of a pulsed laser beam oscillated by the pulsed laser beam oscillating means 6 in the feeding direction (X direction), and focusing means 8 (see FIGS. 1 and 2) for applying the pulsed laser beam passed through the acoustooptic deflecting means 7 to a workpiece held on the chuck table 36.

The pulsed laser beam oscillating means 6 is composed of a pulsed laser beam oscillator 61 such as a YAG laser oscillator or a YVO4 laser oscillator and repetition frequency setting means 62 connected to the pulsed laser beam oscillator 61. The pulsed laser beam oscillator 61 functions to oscillate a pulsed laser beam (LB) having a predetermined frequency set by the repetition frequency setting means 62. The repetition frequency setting means 62 functions to set the repetition frequency of the pulsed laser beam to be oscillated by the pulsed laser beam oscillator 61.

The acoustooptic deflecting means 7 includes an acoustooptic device 71 for deflecting the beam axis of the pulsed laser beam (LB) oscillated by the pulsed laser beam oscillating means 6 in the feeding direction (X direction), an RE oscillator 72 for generating an RE (radio frequency) signal to be applied to the acoustooptic device 71, an RF amplifier 73 for amplifying the power of the RF signal generated by the RE oscillator 72 and applying the amplified RE signal to the acoustooptic device 71, deflection angle adjusting means 74 for adjusting the frequency of the RE signal to be generated by the RE oscillator 72, and power adjusting means 75 for adjusting the amplitude of the RE signal to be generated by the RF oscillator 72. The acoustooptic device 71 can adjust the angle of deflection of the beam axis of the pulsed laser beam according to the frequency of the RE signal applied and can also adjust the power of the pulsed laser beam according to the amplitude of the RF signal applied. The acoustooptic deflecting means 7 as the light deflecting means may be replaced by electrooptic deflecting means using an electrooptic device. The deflection angle adjusting means 74 and the power adjusting means 75 are controlled by the control means to be described later.

Figure 2:
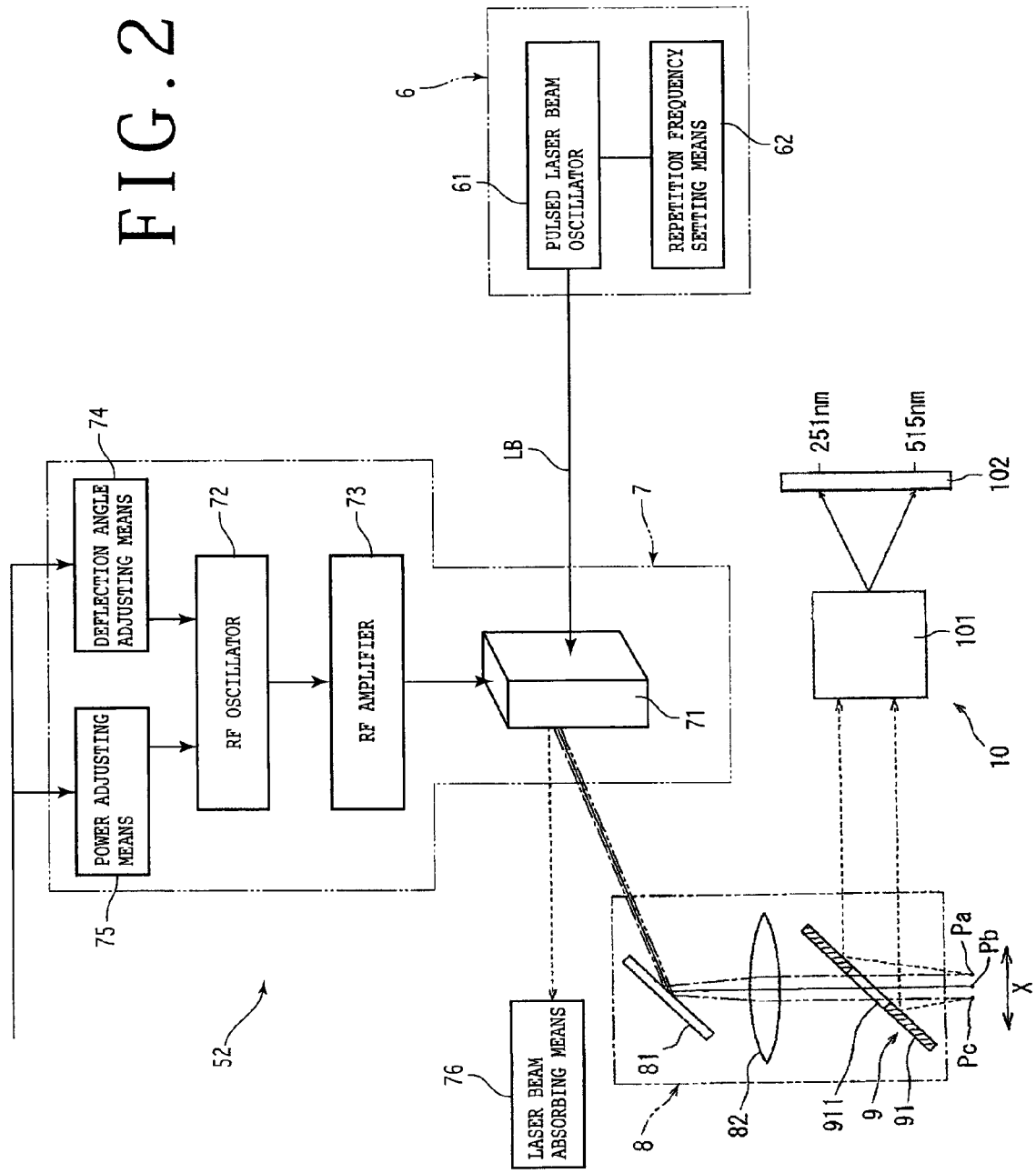
FIG. 2 is a block diagram showing the configuration of laser beam applying means included in the laser processing apparatus shown in FIG. 1.

The laser beam applying means 52 further includes laser beam absorbing means 76 for absorbing the pulsed laser beam deflected by the acoustooptic device 71 as shown by a broken line in FIG. 2 in the case that an RF signal having a predetermined frequency is applied to the acoustooptic device 71. The focusing means 8 is mounted at the front end of the casing 521 and it includes a direction changing mirror 81 for downwardly changing the traveling direction of the pulsed laser beam deflected by the acoustooptic deflecting means 7 and a focusing lens 82 provided by a telecentric lens for focusing the pulsed laser beam whose traveling direction has been changed by the direction changing mirror 81.

The operation of the laser beam applying means 52 will now be described with reference to FIG. 2. In the case that a voltage of 5 V, for example, is applied from the control means to the deflection angle adjusting means 74 of the acoustooptic deflecting means 7 and an RF signal having a frequency corresponding to 5 V is applied to the acoustooptic device 71, the pulsed laser beam oscillated by the pulsed laser beam oscillating means 6 is deflected in beam axis as shown by a single dot & dash line in FIG. 2 and focused at a focal point Pa. In the case that a voltage of 10 V, for example, is applied from the control means to the deflection angle adjusting means 74 and an RF signal having a frequency corresponding to 10 V is applied to the acoustooptic device 71, the pulsed laser beam oscillated by the pulsed laser beam oscillating means 6 is deflected in beam axis as shown by a solid line in FIG. 2 and focused at a focal point Pb displaced from the focal point Pa to the left as viewed in FIG. 2 in the feeding direction (X direction) by a predetermined amount. In the case that a voltage of 15 V, for example, is applied from the control means to the deflection angle adjusting means 74 and an RF signal having a frequency corresponding to 15 V is applied to the acoustooptic device 71, the pulsed laser beam oscillated by the pulsed laser beam oscillating means 6 is deflected in beam axis as shown by a double dot & dash line in FIG. 2 and focused at a focal point Pc displaced from the focal point Pb to the left as viewed in FIG. 2 in the feeding direction (X direction) by a predetermined amount. Further, in the case that a voltage of 0 V, for example, is applied from the control means to the deflection angle adjusting means 74 and an RF signal having a frequency corresponding to 0 V is applied to the acoustooptic device 71, the pulsed laser beam oscillated by the pulsed laser beam oscillating means 6 is led to the laser beam absorbing means 76 as shown a broken line in FIG. 2. Thus, the pulsed laser beam oscillated by the pulsed laser beam oscillating means 6 is deflected to different positions in the feeding direction (X direction), by the acoustooptic device 71 according to the voltage applied to the deflection angle adjusting means 74.

As shown in FIG. 2, the laser processing apparatus 1 includes reflecting means 9 provided on the optical axis of the focusing means 8 for allowing the pass of the pulsed laser beam oscillated by the pulsed laser beam oscillating means 6 and reflecting plasma light generated from the workpiece and wavelength detecting means 10 for detecting the wavelength of the plasma light reflected by the reflecting means 9. In this preferred embodiment shown in FIG. 2, the reflecting means 9 is provided by a mirror 91 having an opening 911 for allowing the pass of the pulsed laser beam.

As shown in FIG. 2, the wavelength detecting means 10 is composed of a diffraction grating 101 for dispersing the light reflected by the reflecting means 9 according to wavelengths and a line image sensor 102 for detecting the light intensity of each spectral ray obtained by the diffraction grating 101 and outputting a light intensity signal. The light intensity signal is output from the line image sensor 102 to the control means. The control means determines the material of the workpiece according to the light intensity signal from the line image sensor 102 of the wavelength detecting means 10, thereby controlling the laser beam applying means 52. In the spectrum diffracted by the diffraction grating 101, the spectral wavelength of silicon is 251 nm, the spectral wavelength of lithium tantalate is 670 nm, and the spectral wavelength of copper is 515 nm. The relation between the material of the workpiece and the wavelength of the plasma is stored in a memory constituting the control means to be described later.

Accordingly, when the spectral wavelength measured by the line image sensor 102 of the wavelength detecting means 10 is near 251 nm, the control means can determine that the workplace being processed by the pulsed laser beam applied from the focusing means 8 of the laser beam applying means 52 is silicon. In contrast, when the spectral wavelength measured by the line image sensor 102 of the wavelength detecting means 10 is near 670 nm, the control means can determine that the workpiece being processed by the pulsed laser beam applied from the focusing means 8 of the laser beam applying means 52 is lithium tantalate. On the other hand, when the spectral wavelength measured by the line image sensor 102 of the wavelength detecting means 10 is near 515 nm, the control means can determine that the workplace being processed by the pulsed laser beam applied from the focusing means 8 of the laser beam applying means 52 is copper. In this preferred embodiment, the reflecting means 9 is located on the optical axis of the focusing means 8, and the plasma light generated by applying the pulsed laser beam to the workpiece can be detected on the optical axis. Accordingly, it is possible to reliably detect the plasma light generated by applying the pulsed laser beam to a bonding pad of metal located at the bottom of a fine hole (laser processed hole).

Referring back to FIG. 1, the laser processing apparatus 1 includes imaging means 11 provided at the front end portion of the casing 521 for imaging a subject area of the workpiece to be laser-processed by the laser beam applying means 52. The imaging means 11 includes an ordinary imaging device (COD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 11 is transmitted to the control means 20 to be described later.

Figure 3:
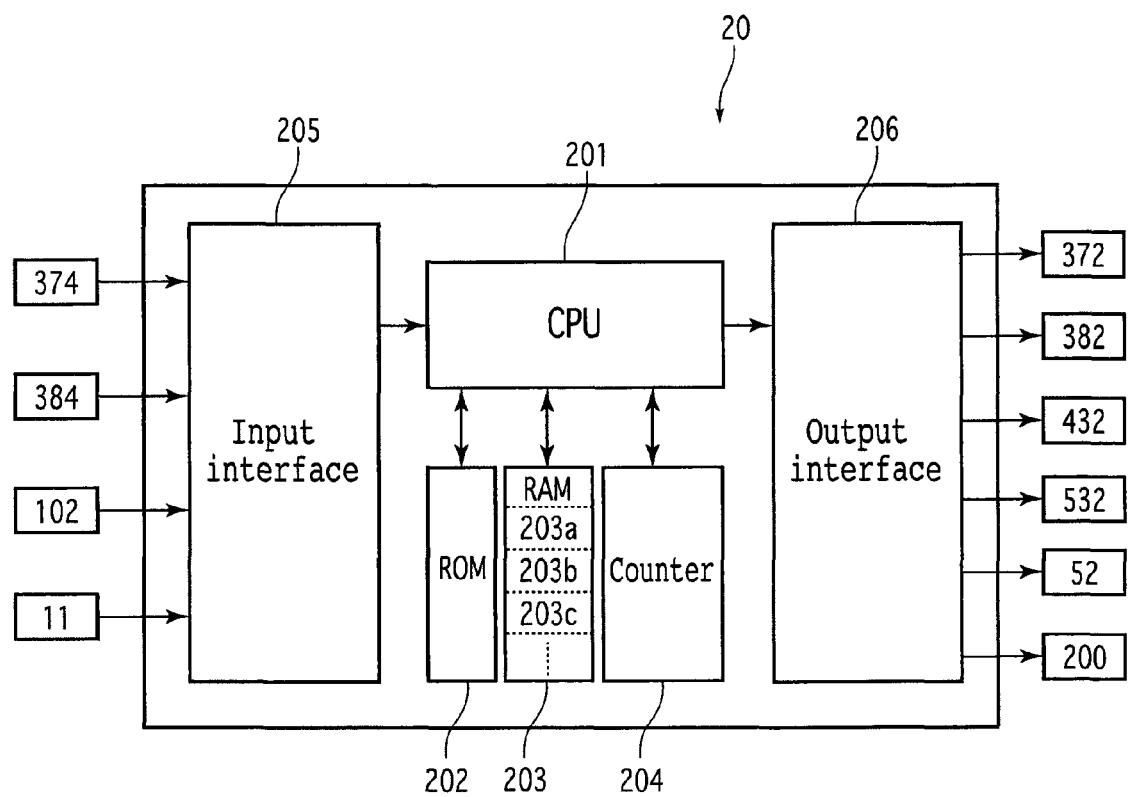
FIG. 3 is a block diagram showing the configuration of control means included in the laser processing apparatus shown in FIG. 1.

The laser processing apparatus 1 includes the control means 20 shown in FIG. 3. The control means 20 is configured by a computer, and it includes a central processing unit (CPU) 201 for performing operational processing according to a control program, a read only memory (ROM) 202 preliminarily storing the control program, a random access memory (RAM) 203 for storing a control map to be described later, data on design value for the workpiece, the results of computation, etc., a counter 204, an input interface 205, and an output interface 206. Detection signals from the X position detecting means 374, the Y position detecting means 384, the line image sensor 102 of the wavelength detecting means 10, and the imaging means 11 are input into the input interface 205 of the control means 20. On the other hand, control signals are output from the output interface 206 of the control means 20 to the pulse motor 372, the pulse motor 382, the pulse motor 432, the pulse motor 532, the laser beam applying means 52, and display means 200. The random access memory (RAM) 203 includes a first memory area 203a for storing the relation between the material of the workpiece and the wavelength of the plasma, a second memory area 203b for storing data on design value for a wafer to be hereinafter described, a third memory area 203c for storing the minimum number of shots of the pulsed laser beam to be hereinafter described, and other memory areas.

Figure 4:
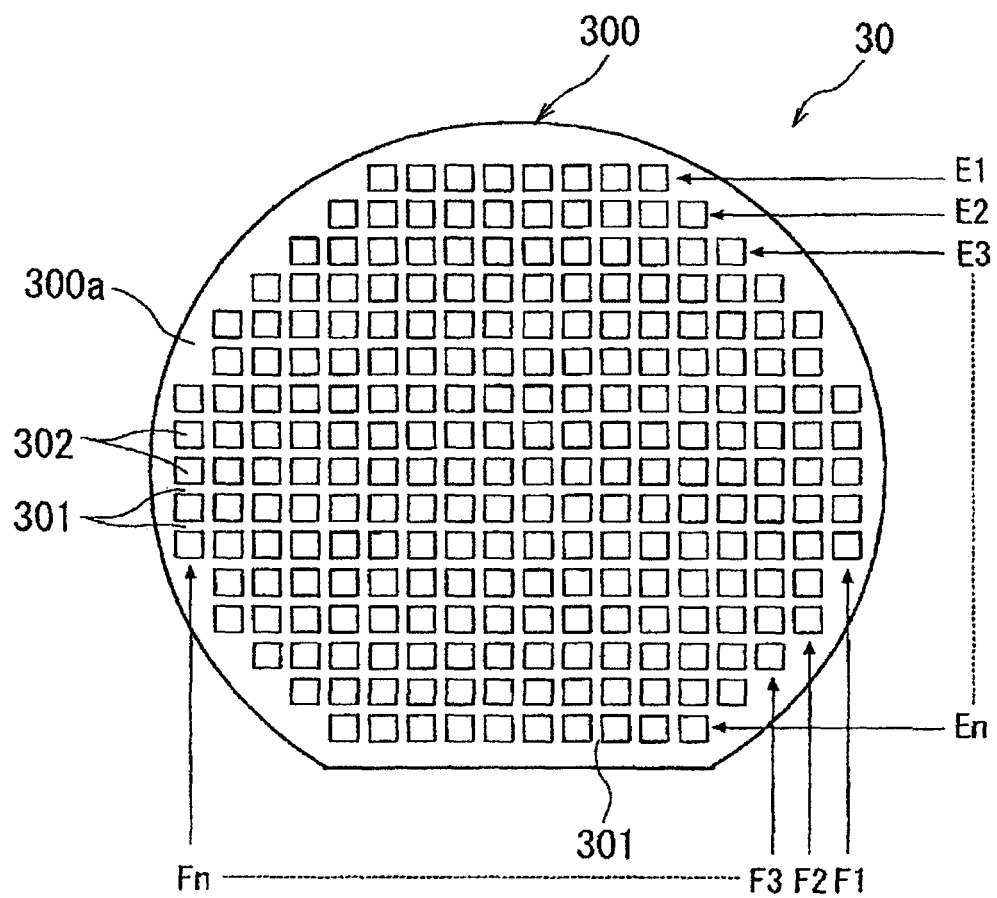
FIG. 4 is a plan view of a semiconductor wafer as a workpiece.
Figure 5:
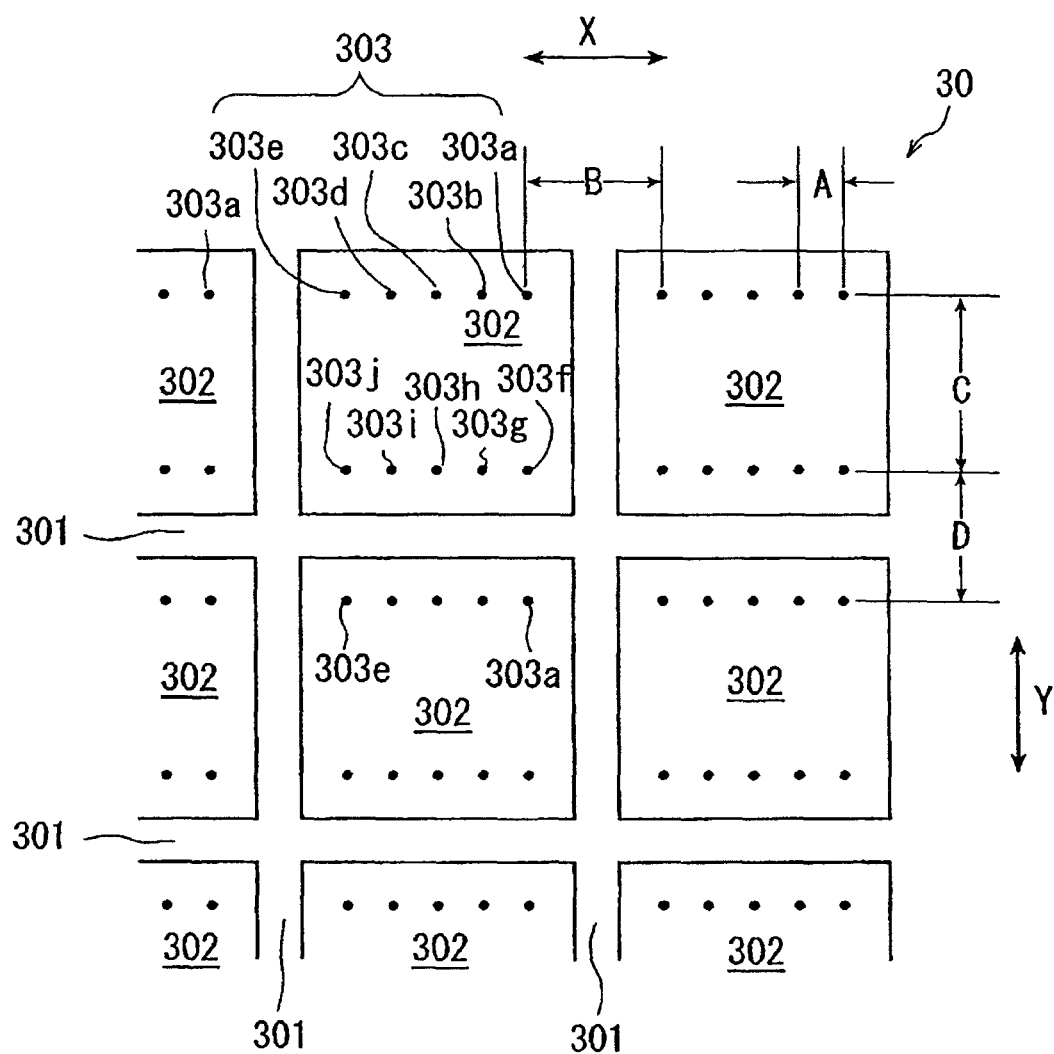
FIG. 5 is an enlarged plan view of an essential part of the semiconductor wafer shown in FIG. 4.

The operation of the laser processing apparatus 1 configured above will now be described. FIG. 4 is a plan view of a semiconductor wafer 30 as the workpiece to be laser-processed, showing the front side of the semiconductor wafer 30. The semiconductor wafer 30 is formed from a silicon substrate 300 (first member). A plurality of crossing division lines 301 are formed on the front side 300a of the silicon substrate 300, thereby partitioning a plurality of rectangular regions where a plurality of devices 302 such as ICs and LSIs are respectively formed. All of the devices 302 have the same configuration. As shown in FIG. 5, a plurality of bonding pads 303 (303a to 303j) (second member) are formed on the front side of each device 302. In this preferred embodiment, these bonding pads 303 (303a to 303j) are formed of copper. The bonding pads 303a and 303f have the same X position, the bonding pads 303b and 303g have the same X position, the bonding pads 303c and 303h have the same X position, the bonding pads 303d and 303i have the same X position, and the bonding pads 303e and 303j have the same X position. The semiconductor wafer 30 is processed by the laser beam to form a laser processed hole (via hole) extending from the back side 300b of the substrate 300 to each bonding pad 303. In each device 302, the bonding pads 303 (303a to 303j) are equally spaced at given intervals A in the X direction (horizontal direction as viewed in FIG. 5). Further, in the adjacent devices 302 opposed in the X direction with respect to the vertical division line 301, the adjacent bonding pads 303 are equally spaced at given intervals B in the X direction. More specifically, the spacing B between the bonding pads 303e and 303a in the adjacent devices 302 in the X direction (horizontal direction as viewed in FIG. 5) is equal to the spacing between the bonding pads 303j and 303f in the adjacent devices 302 in the X direction.

Further, in each device 302, the bonding pads 303 (303a to 303j) are equally spaced at given intervals C in the Y direction (vertical direction as viewed in FIG. 5). Further, in the adjacent devices 302 opposed in the Y direction (vertical direction as viewed in FIG. 5) with respect to the horizontal division line 301, the adjacent bonding pads 303 are equally spaced at given intervals D in the Y direction. More specifically, the spacing D between the bonding pads 303f and 303a in the adjacent devices 302 in the Y direction is equal to the spacing between the bonding pads 303j and 303e in the adjacent devices 302 in the Y direction. Referring to FIG. 4, symbols E1 to En denote the rows of the devices 302 formed on the front side of the semiconductor wafer 30, and symbols F1 to En denote the columns of the devices 302, where n is the integer greater than 1. The number of devices 302 in each of the rows E1 to En and the columns F1 to Fn, the values of the spacings A, B, C, and D mentioned above, and the X and Y coordinate values for all the devices 302 are stored in the second memory area 203b of the random access memory (RAM) 203.

Figure 6:
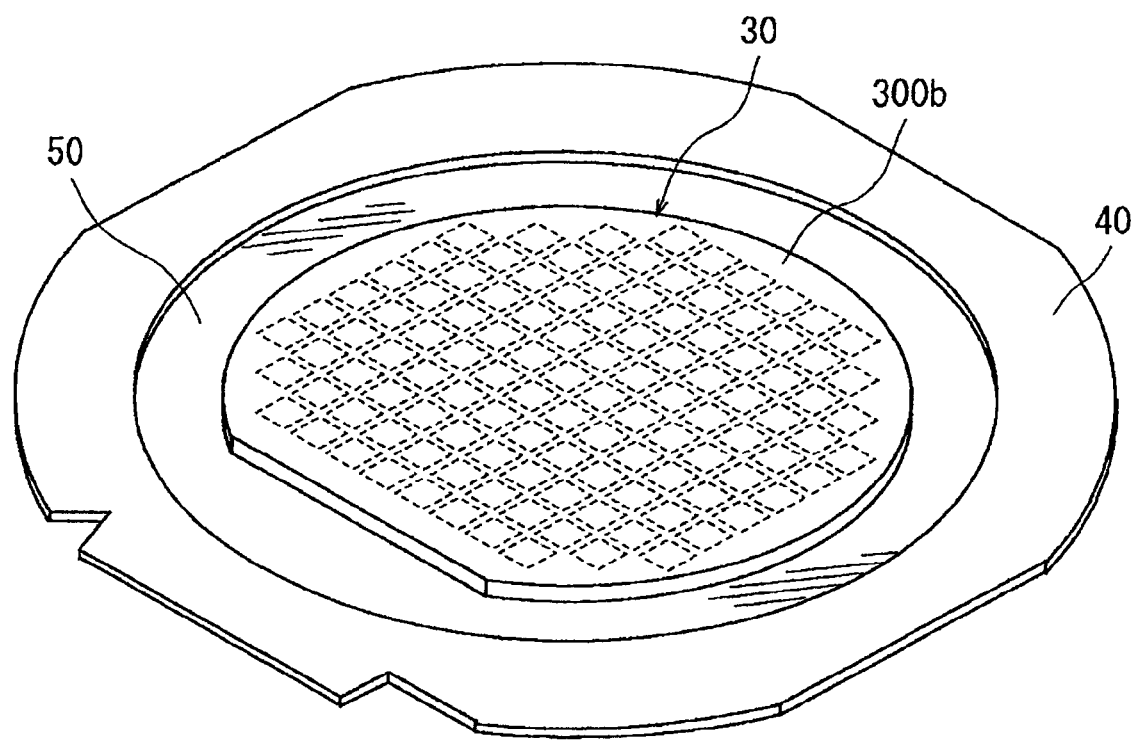
FIG. 6 is a perspective view showing a condition where the semiconductor wafer shown in FIG. 4 is attached to a protective tape supported to an annular frame.

There will now be described a laser processing operation of processing the semiconductor wafer 30 by using the laser processing apparatus 1 to form a laser processed hole (via hole) extending from the back side 300b of the substrate 300 to each of the bonding pads 303 (303a to 303j) in each device 302. As shown in FIG. 6, the semiconductor wafer 30 is supported through a protective tape 50 to an annular frame 40 in such a manner that the front side 300a of the substrate 300 constituting the semiconductor wafer 30 is attached to the protective tape 50. The protective tape 50 is preliminarily supported at its outer circumferential portion to the annular frame 40. The protective tape 50 is formed from a synthetic resin sheet such as a polyolefin sheet. Accordingly, the back side 300b of the substrate 300 constituting the semiconductor wafer 30 attached to the protective tape 50 is oriented upward. The semiconductor wafer 30 supported through the protective tape 50 to the annular frame 40 is placed on the chuck table 36 of the laser processing apparatus 1 shown in FIG. 1 in the condition where the protective tape 50 comes into contact with the upper surface of the chuck table 36. Thereafter, the suction means is operated to hold the semiconductor wafer 30 through the protective tape 50 on the chuck table 36 under suction. Accordingly, the semiconductor wafer 30 is held on the chuck table 36 in the condition where the back side 300b of the substrate 300 constituting the semiconductor wafer 30 is oriented upward. Further, the annular frame 40 is fixed by the clamps 362.

Thereafter, the feeding means 37 is operated to move the chuck table 36 holding the semiconductor wafer 30 to a position directly below the imaging means 11. In the condition where the chuck table 36 is positioned directly below the imaging means 11, the semiconductor wafer 30 on the chuck table 36 is set at the coordinate position shown in FIG. 7. In this condition, an alignment operation is performed to detect whether or not the crossing division lines 301 of the semiconductor wafer 30 held on the chuck table 36 are parallel to the X direction and the Y direction. That is, the imaging means 11 is operated to image the semiconductor wafer 30 held on the chuck table 36 and perform image processing such as pattern matching, thus performing the alignment operation. Although the front side 300a on which the division lines 301 of the semiconductor wafer 30 are formed is oriented downward, the division lines 301 can be imaged from the back side 300b through the substrate 300 of the semiconductor wafer 30 because the imaging means 11 includes the infrared light applying means for applying infrared light, the optical system for capturing the infrared light, and the imaging device (infrared CCD) for outputting an electrical signal corresponding to the infrared light.

Figure 7:
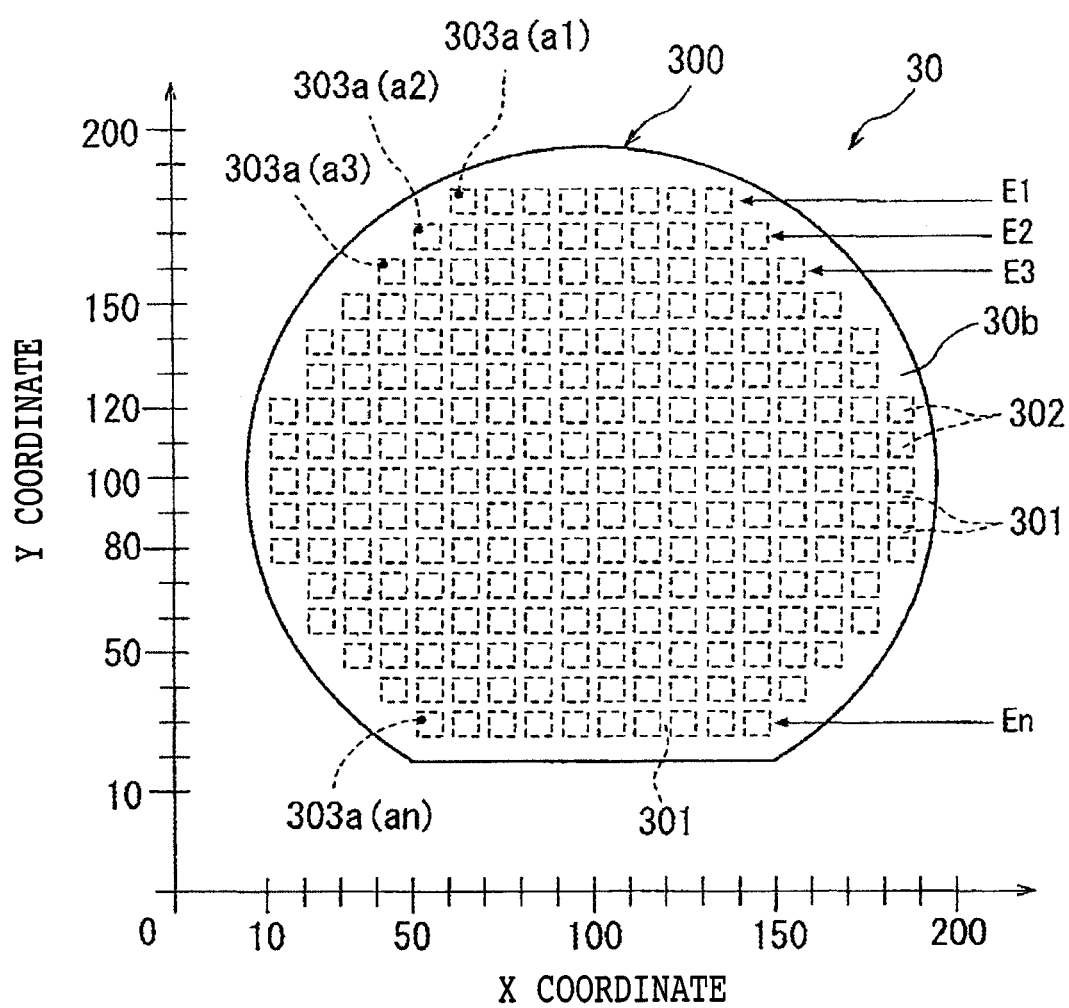
FIG. 7 is a plan view showing the relation between the semiconductor wafer shown in FIG. 4 and coordinates in the condition where the wafer is held at a predetermined position on a chuck table included in the laser processing apparatus shown in FIG. 1.

Thereafter, the chuck table 36 is moved to position the leftmost device 302 on the uppermost row E1 as viewed in FIG. 7 directly below the imaging means 11 of all the devices 302 formed on the semiconductor wafer 30. Further, the left upper bonding pad 303a of the bonding pads 303 (303a to 303j) in this leftmost device 302 as viewed in FIG. 7 is positioned directly below the imaging means 11. In this condition, the bonding pad 303a is detected by the imaging means 11 and the coordinate value (a1) for the bonding pad 303a is sent as a first feed start position coordinate value to the control means 20. The control means 20 stores this coordinate value (a1) as the first feed start position coordinate value into the random access memory (RAM) 203 (feed start position detecting step). The imaging means 11 and the focusing means 8 of the laser beam applying means 52 are spaced a predetermined distance in the X direction. Accordingly, the sum of the X coordinate value constituting the first feed start position coordinate value and the above predetermined distance between the imaging means 11 and the focusing means 8 is stored into the RAM 203.

After detecting the first feed start position coordinate value (a1) in the leftmost device 302 on the uppermost row E1 as viewed in FIG. 7, the chuck table 36 is moved in the Y direction by the pitch of the division lines 301 and also moved in the X direction to position the leftmost device 302 on the second uppermost row E2 as viewed in FIG. 7 directly below the imaging means 11. Further, the left upper bonding pad 303a of the bonding pads 303 (303a to 303j) in this leftmost device 302 as viewed in FIG. 7 is positioned directly below the imaging means 11. In this condition, the bonding pad 303a is detected by the imaging means 11 and the coordinate value (a2) for the bonding pad 303a is sent as a second feed start position coordinate value to the control means 20. The control means 20 stores this coordinate value (a2) as the second feed start position coordinate value into the random access memory (RAM) 203. As mentioned above, the imaging means 11 and the focusing means 8 of the laser beam applying means 52 are spaced a predetermined distance in the X direction. Accordingly, the sum of the X coordinate value constituting the second feed start position coordinate value and the above distance between the imaging means 11 and the focusing means 8 is stored into the RAM 203. Thereafter, the control means 20 repeatedly performs the indexing operation and the feed start position detecting step mentioned above until the lowermost row En as viewed in FIG. 7 to detect the feed start position coordinate values (a3 to an) for the leftmost devices 302 on the other rows (E3 to En) and store these coordinate values into the random access memory (RAM) 203. Of all the devices 302 formed on the semiconductor wafer 30, the leftmost device 302 on the lowermost row En as viewed in FIG. 7 is set as a measurement device, and the feed start position coordinate value (an) for this measurement device is stored as a measurement position coordinate value (an) into the random access memory (RAM) 203.

Figure 8A:
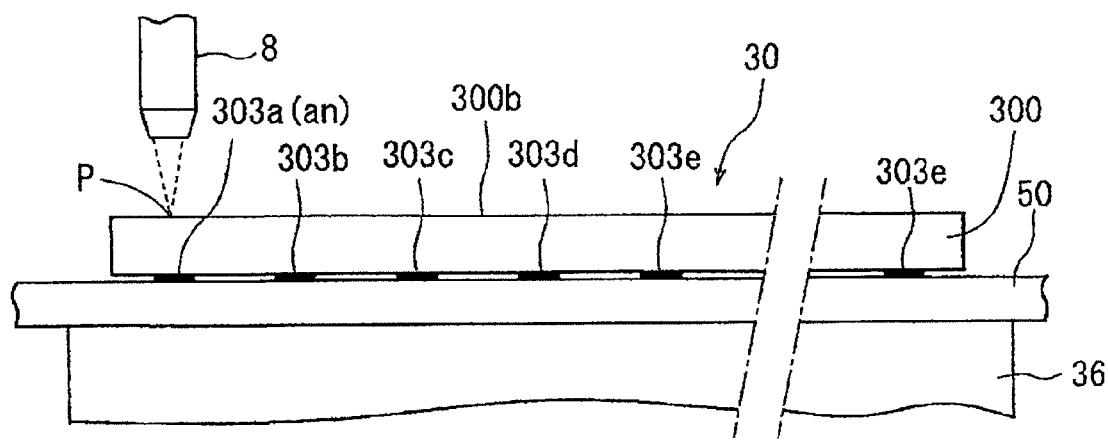
FIGS. 8A and 8B are partially cutaway sectional side views for illustrating a minimum shot number setting step and a maximum shot number setting step in the hole forming method according to the present invention.

After performing the feed start position detecting step mentioned above, the chuck table 36 is moved so that the bonding pad 303a corresponding to the measurement position coordinate value (an) stored in the random access memory (RAM) 203 is positioned directly below the focusing means 8 of the laser beam applying means 52. FIG. 8A shows this condition where the bonding pad 303a corresponding to the measurement position coordinate value (an) is positioned directly below the focusing means B. Thereafter, the control means 20 applies a voltage of 10 V, for example, to the deflection angle adjusting means 74 to set the beam axis of the pulsed laser beam oscillated by the pulsed laser beam oscillating means 6 as shown by the solid line in FIG. 2 so that the pulsed laser beam is focused at the focal point Pb. Thereafter, the control means 20 operates the laser beam applying means 52 to apply the pulsed laser beam from the focusing means 8 to the semiconductor wafer 30, thereby forming a laser processed hole extending from the back side 300b of the silicon substrate 300 to the bonding pad 303a. In forming the laser processed hole, the number of shots of the pulsed laser beam oscillated by the pulsed laser beam oscillating means 6 is counted by the counter 204 of the control means 20, and the wavelength detecting means 10 is operated to input a detection signal from the line image sensor 102 to the control means 20.

Figure 8B:
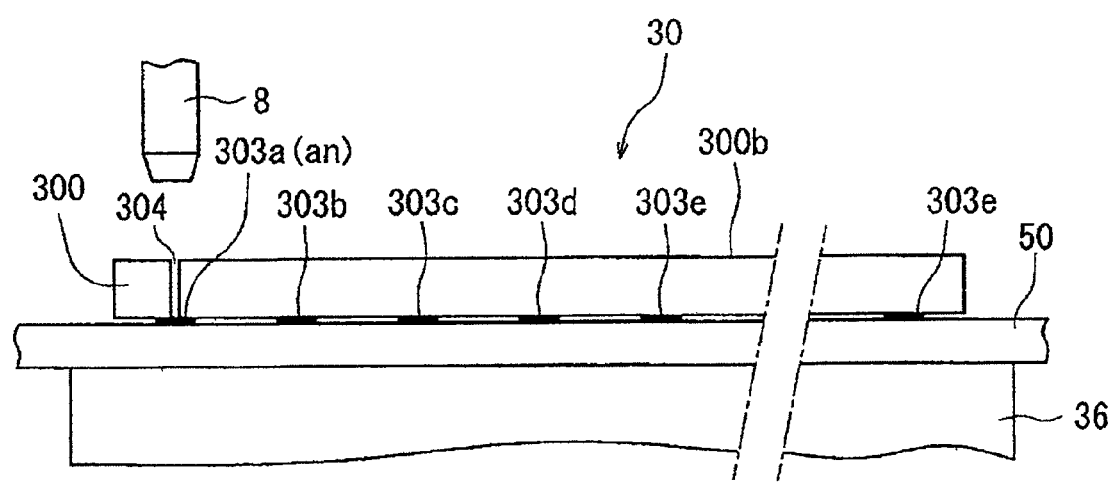

When the spectral wavelength measured by the line image sensor 102 of the wavelength detecting means 10 is 251 nm, the control means 20 determines that the silicon substrate 300 is being processed and therefore continues to apply the pulsed laser beam. When the spectral wavelength measured by the line image sensor 102 of the wavelength detecting means 10 has changed to 515 nm, the control means 20 determines that the bonding pad 303a formed of copper has just been processed. Further, the control means 20 sets the number of shots of the pulsed laser beam at the time of this change in spectral wavelength as a minimum value and stores this minimum shot number into the random access memory (RAM) 203 (minimum shot number setting step). The control means 20 continues to apply the pulsed laser beam. When the spectral wavelength measured by the line image sensor 102 of the wavelength detecting means 10 has completely changed from 251 nm to 515 nm, the control means 20 sets the number of shots of the pulsed laser beam at the time of this change in spectral wavelength as a maximum value and stores this maximum shot number into the random access memory (RAM) 203 (maximum shot number setting step). At the same time, the control means 20 applies a voltage of 0 V to the deflection angle adjusting means 74 of the acoustooptic deflecting means 7 to thereby lead the pulsed laser beam oscillated by the pulsed laser beam oscillating means 6 to the laser beam absorbing means 76 as shown by the broken line in FIG. 2. As a result, in the measurement device used to perform the minimum shot number setting step and the maximum shot number setting step, a laser processed hole 304 extending from the back side of the device to the bonding pad 303a is formed as shown in FIG. 8B. Although the bonding pad 303a may be melted to be perforated by the formation of the laser processed hole 304, the device 302 set as a measurement device is not used as a product.

Figure 9A:
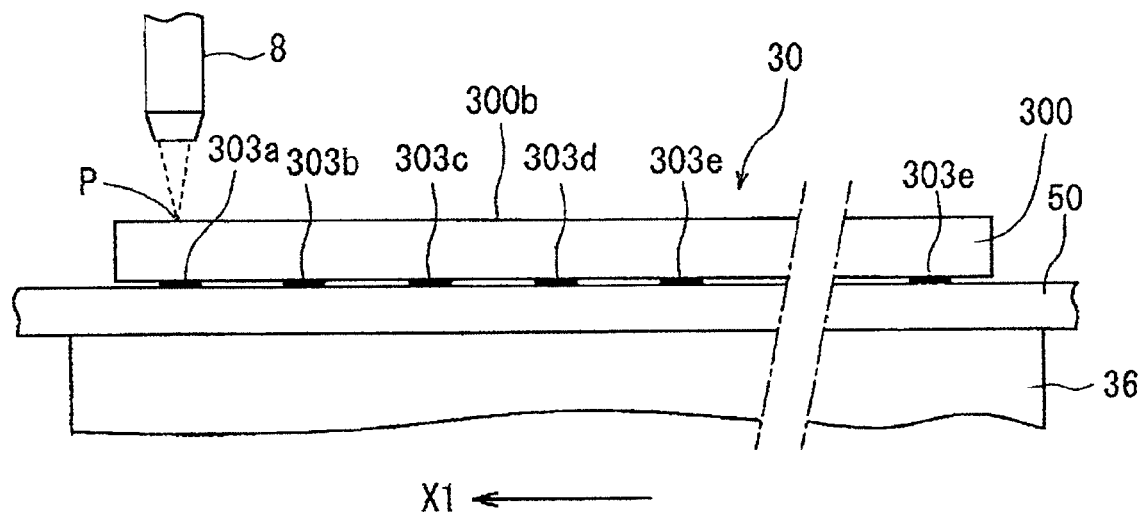
FIGS. 9A and 9B are partially cutaway sectional side views for illustrating a hole forming step in the hole forming method according to the present invention.

For example, the processing conditions in the minimum shot number setting step and the maximum shot number setting step are set as follows:

Light source: LD pumped Q-switched Nd:YVO4 pulsed laser
 Wavelength: 355 nm
 Repetition frequency: 50 kHz
 Average power: 2 W
 Focused spot diameter: 50 μm After performing the minimum shot number setting step and the maximum shot number setting step mentioned above, a hole forming step is performed to form a laser processed hole (via hole) through the substrate 300 of the semiconductor wafer 30 at the back side of each of the bonding pads 303 (303a to 303j) formed in each device 302. In this hole forming step, the feeding means 37 is first operated to move the chuck table 36 so that the bonding pad 303a corresponding to the first feed start position coordinate value (a1) stored in the random access memory (RAM) 203 is positioned directly below the focusing means 8 of the laser beam applying means 52. FIG. 9A shows this condition where the bonding pad 303a corresponding to the first feed start position coordinate value (a1) is positioned directly below the focusing means 8. Then, the feeding means 37 is controlled by the control means 20 to feed the chuck table 36 at a predetermined feed speed in the direction shown by an arrow X1 in FIG. 9A. At the same time, the laser beam applying means 52 is controlled by the control means 20 to apply a pulsed laser beam from the focusing means 8 to the semiconductor wafer 30. The focal point P of the pulsed laser beam to be applied from the focusing means 8 is set near the back side 300b of the substrate 300 of the semiconductor wafer 30. At this time, the control means 20 outputs a control signal for controlling the deflection angle adjusting means 74 and the power adjusting means 75 of the acoustooptic deflecting means 7 according to a detection signal from the read head 374b of the X position detecting means 374.

On the other hand, the RF oscillator 72 outputs an RF signal corresponding to the control signal from the deflection angle adjusting means 74 and the power adjusting means 75. The power of the RF signal output from the RF oscillator 72 is amplified by the RF amplifier 73, and the amplified RF signal is applied to the acoustooptic device 71. As a result, the acoustooptic device 71 deflects the beam axis of the pulsed laser beam oscillated by the pulsed laser beam oscillating means 6 in the range from the position shown by the single dot & dash line in FIG. 2 to the position shown by the double dot & dash line in FIG. 2 in synchronism with the feed speed, thereby applying the pulsed laser beam at the same position. As a result, the pulsed laser beam having a predetermined power can be applied to the semiconductor wafer 30 at the position of the bonding pad 303a corresponding to the first feed start position coordinate value (a1). The processing conditions in the hole forming step mentioned above are the same as those in the minimum shot number setting step and the maximum shot number setting step mentioned above.

In performing the hole forming step, the control means 20 operates the counter 204 to count the number of shots of the pulsed laser beam oscillated by the pulsed laser beam oscillating means 6 and also operates the wavelength detecting means 10 to input a detection signal from the line image sensor 102. In the case that the spectral wavelength measured by the line image sensor 102 of the wavelength detecting means 10 is 251 nm even after the number of shots of the pulsed laser beam has reached the minimum value, the control means 20 determines that the silicon substrate 300 is being processed and then continues to perform the hole forming step. In contrast, when the number of shots of the pulsed laser beam has reached the minimum value and the spectral wavelength measured by the line image sensor 102 of the wavelength detecting means 10 has changed from 251 nm to 515 nm, the control means 20 determines that the bonding pad 303 formed of copper has been processed and then applies a voltage of 0 V to the deflection angle adjusting means 74 of the acoustooptic deflecting means V. Accordingly, an RF signal having a frequency corresponding to 0 V is applied to the acoustooptic device 71, so that the pulsed laser beam oscillated by the pulsed laser beam oscillating means 6 is led to the laser beam absorbing means 76 as shown by the broken line in FIG. 2. Accordingly, the pulsed laser beam is not applied to the semiconductor wafer 30 held on the chuck table 36.

When the pulsed laser beam is applied to the bonding pad 303, the line image sensor 102 of the wavelength detecting means 10 detects that the bonding pad 303 has been processed and the control means 20 accordingly stops the application of the pulsed laser beam to the bonding pad 303, thereby preventing the bonding pad 303 from being melted to be perforated. As a result, a laser processed hole 304 reaching the bonding pad 303 is formed through the silicon substrate 300 of the semiconductor wafer 30 as shown in FIG. 93. The reflecting means 9 is located on the optical axis of the focusing means 8, and the plasma light generated by applying the pulsed laser beam to the semiconductor wafer 30 as the workpiece can be detected on the optical axis by the wavelength detecting means 10 to thereby detect that the bonding pad 303 has been processed. Accordingly, it is possible to reliably detect the plasma light generated by applying the pulsed laser beam to the bonding pad 303 of copper located at the bottom of the laser processed hole 304.

Further, in the case that the spectral wavelength measured by the line image sensor 102 of the wavelength detecting means 10 remains 251 nm, i.e., does not change to the spectral wavelength (515 nm) of copper forming the bonding pad 303 even after the number of shots of the pulsed laser beam has reached the minimum value in the hole forming step, the control means 20 continues to apply the pulsed laser beam until the number of shots of the pulsed laser beam reaches the maximum value. When the number of shots of the pulsed laser beam has reached the maximum value, the control means 20 applies a voltage of 0 V to the deflection angle adjusting means 74 of the acoustooptic deflecting means 7 to thereby lead the pulsed laser beam oscillated by the pulsed laser beam oscillating means 6 to the laser beam absorbing means 76 as shown by the broken line in FIG. 2. In this manner, in the case that the spectral wavelength measured by the line image sensor 102 does not change to the spectral wavelength (515 nm) of copper forming the bonding pad 303, the application of the pulsed laser beam is stopped at the time the number of shots of the pulsed laser beam has reached the maximum value. Accordingly, even when the plasma light is not properly generated, there is no possibility that the bonding pad 303 may be melted to be perforated.

Figure 9B:
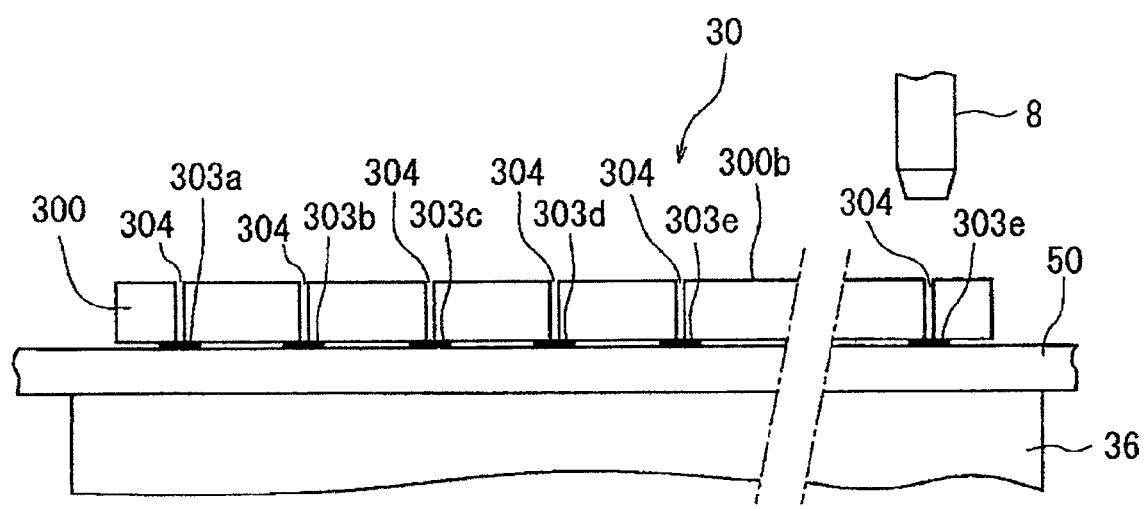

The control means 20 inputs a detection signal from the read head 374b of the X position detecting means 374 and counts this detection signal through the counter 204. When the count value by the counter 204 reaches the coordinate value for the next bonding pad 303, the control means 20 controls the laser beam applying means 52 to similarly perform the hole forming step. Thereafter, every time the count value by the counter 204 reaches the coordinate value for each bonding pad 303, the control means 20 operates the laser beam applying means 52 to similarly perform the hole forming step. When the hole forming step is performed at the position of the rightmost bonding pad 303e in the rightmost device 302 on the uppermost row E1 as shown in FIG. 9B, the operation of the feeding means 37 is stopped to stop the movement of the chuck table 36. As a result, a plurality of laser processed holes 304 respectively reaching the bonding pads 303 are formed through the silicon substrate 300 of the semiconductor wafer 30 as shown in FIG. 9B.

Figure 10A:
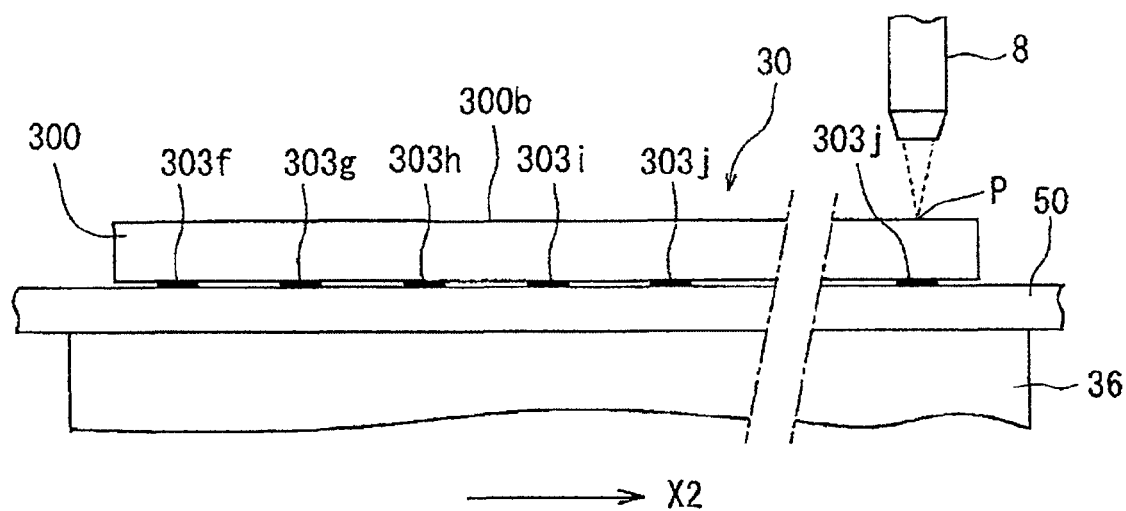
FIGS. 10A and 10B are views showing the step subsequent to the step shown in FIGS. 9A and 9B.
Figure 10B:
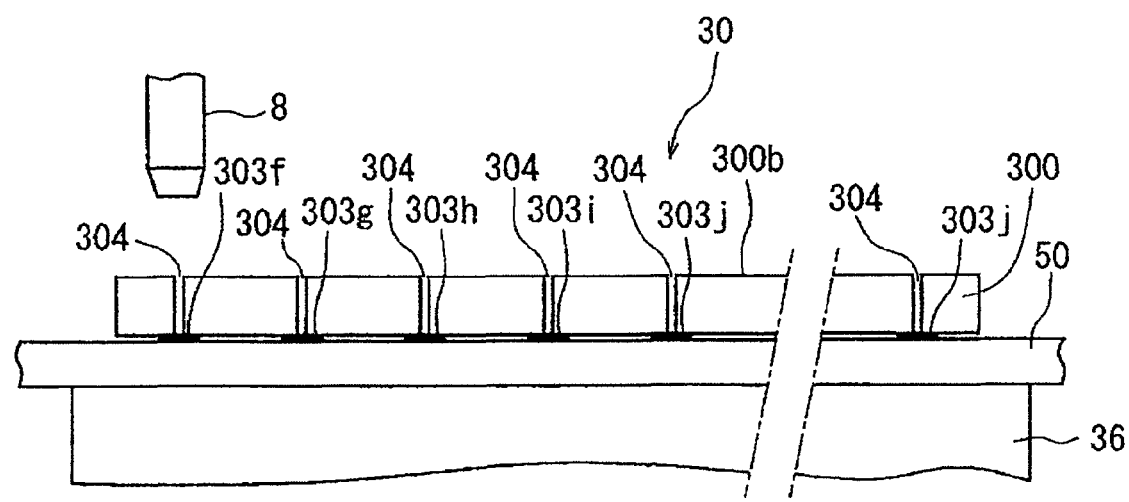

Thereafter, the control means 20 controls the first indexing means 38 to index the focusing means 8 of the laser beam applying means 52 in the direction perpendicular to the sheet plane of FIG. 9B, i.e., in the Y direction. On the other hand, the control means 20 inputs a detection signal from the read head 384b of the Y position detecting means 384 and counts this detection signal through the counter 204. When the count value by the counter 204 reaches a value corresponding to the spacing C of the bonding pads 303 in the Y direction shown in FIG. 5, the operation of the first indexing means 38 is stopped to stop the indexing of the focusing means 8 of the laser beam applying means 52. As a result, the focusing means 8 is positioned directly above the bonding pad 303j (see FIG. 5) opposed to the bonding pad 303e in the Y direction. FIG. 10A shows this condition. In the condition shown in FIG. 10A, the control means 20 controls the feeding means 37 to feed the chuck table 36 in the direction shown by an arrow X2 in FIG. 10A at a predetermined feed speed. At the same time, the control means 20 operates the laser beam applying means 52 to perform the hole forming step. As described above, the control means 20 inputs a detection signal from the read head 374b of the X position detecting means 374 and counts this detection signal through the counter 204. Every time the count value by the counter 204 reaches the coordinate value for each bonding pad 303, the control means 20 operates the laser beam applying means 52 to similarly perform the hole forming step. When the hole forming step is performed at the position of the leftmost bonding pad 303f in the leftmost device 302 on the uppermost row E1 as shown in FIG. 10B, the operation of the feeding means 37 is stopped to stop the movement of the chuck table 36. As a result, a plurality of laser processed holes 304 respectively reaching the bonding pads 303 are formed through the silicon substrate 300 of the semiconductor wafer 30 as shown in FIG. 10B.

Thus, the laser processed holes 304 are formed through the substrate 300 of the semiconductor wafer 30 at the positions corresponding to the bonding pads 303 in each device 302 on the uppermost row E1 as described above. Thereafter, the control means 20 operates the feeding means 37 and the first indexing means 38 position the bonding pad 303 corresponding to the second feed start position coordinate value (a2) directly below the focusing means 8 of the laser beam applying means 52, wherein the bonding pad 303 corresponding to the second feed start position coordinate value (a2) is formed in the leftmost device 302 on the second uppermost row E2 and the second feed start position coordinate value (a2) is stored in the random access memory (RAM) 203. Thereafter, the control means 20 controls the laser beam applying means 52, the feeding means 37, and the first indexing means 38 to perform the hole forming step at the positions corresponding to the bonding pads 303 in the other devices 302 on the second uppermost row E2 of the semiconductor wafer 30. Thereafter, the hole forming step is similarly performed at the positions corresponding to the bonding pads 303 in all the devices 302 on the other rows E3 to En of the semiconductor wafer 30. As a result, a plurality of laser processed holes 304 respectively reaching the bonding pads 303 in all the devices 302 are formed through the silicon substrate 300 of the semiconductor wafer 30.

In the hole forming step mentioned above, the pulsed laser beam is not applied to the areas of the semiconductor wafer 30 corresponding to the spacing A and the spacing B in the X direction shown in FIG. 5 and the areas of the semiconductor wafer 30 corresponding to the spacing C and the spacing D in the Y direction shown in FIG. 5. To avoid the application of the pulsed laser beam to these areas corresponding to the spacings A, B, C, and D in the semiconductor wafer 30, the control means 20 applies a voltage of 0 V to the deflection angle adjusting means 74 of the acoustooptic deflecting means 7. As a result, an RF signal having a frequency corresponding to 0 V is applied to the acoustooptic device 71, so that the pulsed laser beam (LB) oscillated by the pulsed laser beam oscillating means 6 is led to the laser beam absorbing means 76 as shown by the broken line in FIG. 2, thereby avoiding the application of the pulsed laser beam to the semiconductor wafer 30.

While a specific preferred embodiment of the present invention has been described, it should be noted that the present invention is not limited to the above preferred embodiment, but various modifications may be made within the scope of the present invention. For example, in the above preferred embodiment, the plural laser processed holes are formed in the wafer including the substrate (first member), the plural devices formed on the front side of the substrate, and the plural bonding pads (second member) provided on each device, wherein the plural laser processed holes respectively extend from the back side of the substrate (first member) to the plural bonding pads (second member). However, the present invention is widely applicable to the case of forming a laser processed hole in a workpiece configured by bonding a first member formed of a first material and a second member formed of a second material, wherein the laser processed hole extends from the first member to the second member.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A hole forming method of forming a laser processed hole in a workpiece configured by bonding a first member formed of a first material and a second member formed of a second material, said laser processed hole extending from said first member to said second member, said hole forming method comprising:

a minimum shot number setting step of applying a pulsed laser beam to an arbitrary area of said workpiece from the side of said first member to form said laser processed hole, counting the number of shots of said pulsed laser beam, measuring a material-inherent spectral wavelength of plasma generated by the application of said pulsed laser beam, and setting as a minimum value the number of shots of said pulsed laser beam at the time the spectral wavelength of said plasma has changed from the spectral wavelength inherent in said first material to the spectral wavelength inherent in said second material;

a maximum shot number setting step of setting as a maximum value the number of shots of said pulsed laser beam at the time the spectral wavelength of said plasma has completely changed from the spectral wavelength inherent in said first material to the spectral wavelength inherent in said second material; and a hole forming step of applying said pulsed laser beam to a predetermined position on said workpiece from the side of said first member to form said laser processed hole, counting the number of shots of said pulsed laser beam, measuring the material-inherent spectral wavelength of said plasma generated by the application of said pulsed laser beam, and stopping the application of said pulsed laser beam in the case that the number of shots of said pulsed laser beam has reached said minimum value and the spectral wavelength of said plasma has changed from the spectral wavelength inherent in said first material to the spectral wavelength inherent in said second material, whereas continuing the application of said pulsed laser beam until the number of shots of said pulsed laser beam reaches said maximum value in the case that the spectral wavelength of said plasma has not changed from the spectral wavelength inherent in said first material to the spectral wavelength inherent in said second material even after the number of shots of said pulsed laser beam has reached said minimum value.

2. A laser processing apparatus for forming a laser processed hole in a workpiece configured by bonding a first member formed of a first material and a second member formed of a second material, said laser processed hole extending from said first member to said second member, said laser processing apparatus comprising:

workpiece holding means for holding said workpiece;

laser beam applying means for applying a pulsed laser beam to said workpiece held by said workpiece holding means;

moving means for relatively moving said workpiece holding means and said laser beam applying means;

plasma detecting means for detecting a spectral wavelength of plasma generated by applying said pulsed laser beam from said laser beam applying means to said workpiece; and control means having a memory for storing a minimum value and a maximum value for the number of shots of said pulsed laser beam as required for the formation of said laser processed hole and a counter for counting the number of shots of said pulsed laser beam applied by said laser beam applying means, said control means controlling said laser beam applying means according to a count value from said counter and a detection signal from said plasma detecting means, wherein said control means controls said laser beam applying means so that said pulsed laser beam is applied to a predetermined position on said workpiece from the side of said first member to form said laser processed hole, and the application of said pulsed laser beam is stopped in the case that the number of shots of said pulsed laser beam has reached said minimum value and the spectral wavelength of said plasma has changed from the spectral wavelength inherent in said first material to the spectral wavelength inherent in said second material, whereas the application of said pulsed laser beam is continued until the number of shots of said pulsed laser beam reaches said maximum value in the case that the spectral wavelength of said plasma has not changed from the spectral wavelength inherent in said first material to the spectral wavelength inherent in said second material even after the number of shots of said pulsed laser beam has reached said minimum value.

\* \* \* \* \*